United States Patent
Dieny et al.

(10) Patent No.: US 9,308,641 B2
(45) Date of Patent: Apr. 12, 2016

(54) PROCESS FOR FABRICATING A MAGNETIC TWEEZER

(75) Inventors: Bernard Dieny, Lans en Vercors (FR); Philippe Sabon, Moirans (FR); Hélène Joisten, Grenoble (FR)

(73) Assignee: COMMISSARIAT A L'ENERGIE ET AUX ENERGIES ALTERNATIVES, Paris (FR)

( * ) Notice: Subject to any disclaimer, the term of this patent is extended or adjusted under 35 U.S.C. 154(b) by 280 days.

(21) Appl. No.: 13/814,024

(22) PCT Filed: Aug. 3, 2011

(86) PCT No.: PCT/EP2011/063403
§ 371 (c)(1),
(2), (4) Date: Feb. 26, 2013

(87) PCT Pub. No.: WO2012/017024
PCT Pub. Date: Feb. 9, 2012

(65) Prior Publication Data
US 2013/0169393 A1    Jul. 4, 2013

(30) Foreign Application Priority Data

Aug. 4, 2010 (FR) ..................... 10 56447

(51) Int. Cl.
*H01F 7/06* (2006.01)
*B25J 7/00* (2006.01)
*B81C 99/00* (2010.01)
*B82Y 25/00* (2011.01)
*B82Y 40/00* (2011.01)
(Continued)

(52) U.S. Cl.
CPC ... *B25J 7/00* (2013.01); *B81B 7/00* (2013.01);
*B81C 99/002* (2013.01); *B81C 99/008* (2013.01); *B82Y 25/00* (2013.01); *B82Y 40/00* (2013.01); *H01F 41/30* (2013.01); *B81B 2201/06* (2013.01); *B81B 2203/06* (2013.01); *B81C 2201/038* (2013.01)

(58) Field of Classification Search
CPC .............................. Y10T 29/4902; H02K 7/14
USPC .................... 29/602.1, 592.1, 607, 719, 744; 417/423.7
See application file for complete search history.

(56) References Cited

U.S. PATENT DOCUMENTS 5,670,712 A * 9/1997 Cleveland et al. ............. 73/105
6,400,549 B1 * 6/2002 Davis et al. .................. 361/144
(Continued)

FOREIGN PATENT DOCUMENTS

WO    WO 2009/111737    9/2009

OTHER PUBLICATIONS

Giouroudi, I., et al., "Development of a microgripping system for handling of microcomponehts," Precision Engineering, vol. 32, 2008, pp. 148-152.
(Continued)

*Primary Examiner* — Paul D Kim
(74) *Attorney, Agent, or Firm* — Pillsbury Winthrop Shaw Pittman LLP

(57) ABSTRACT

Magnetic tweezers have two jaws formed by thin magnetic films connected together via a hinge. The magnetic tweezers include a nanoparticle formed by a stack of thin magnetic films. A process for fabricating the magnetic tweezers by techniques used in the fabrication of microelectronic components is presented.

15 Claims, 7 Drawing Sheets

Figure 4A:
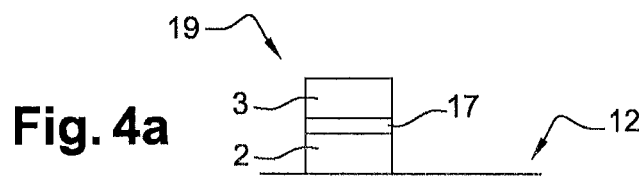

(51) Int. Cl.
  *H01F 41/30* (2006.01)
  *B81B 7/00* (2006.01)

(56) References Cited

U.S. PATENT DOCUMENTS

| | | | |
|---|---|---|---|
| 7,892,427 B2 * | 2/2011 | Barbic et al. | 210/222 |
| 8,701,893 B2 * | 4/2014 | Tung et al. | 209/214 |
| 2003/0158474 A1 * | 8/2003 | Scherer et al. | 600/409 |
| 2004/0021073 A1 * | 2/2004 | Barbic et al. | 250/298 |
| 2006/0180884 A1 * | 8/2006 | Ng et al. | 257/421 |
| 2006/0181097 A1 * | 8/2006 | Choi et al. | 294/115 |
| 2009/0092509 A1 * | 4/2009 | Barbic et al. | 417/423.7 |
| 2009/0249612 A1 * | 10/2009 | Fullerton et al. | 29/602.1 |

OTHER PUBLICATIONS

Kim, D-H., et al., "Biofunctionalized magnetic-vortex microdiscs for targeted cancer-cell destruction," Nature Materials, vol. 9, Feb. 2010, pp. 165-171.
International Search Report as issued for PCT/EP2011/063403.
Okawa, K., et al., "Heating ability of magnetite nanobeads with various sizes for magnetic hyperthermia at 120kHz, a noninvasive frequency," Journal of Applied Physics, vol. 99, 2006, 4 pgs.
Pankhurst, Q.A., et al., "Applications of magnetic nanoparticles in biomedicine," Journal of Physics D: Applied Physics, vol. 36, 2003, pp. R167-R181.
Su, H., et al., "A Novel Underwater Actuator Driven by Magnetization Repulsion/Attraction," Micro Electro Mechanical Systems, IEEE, 2009, pp. 1051-1054.

* cited by examiner

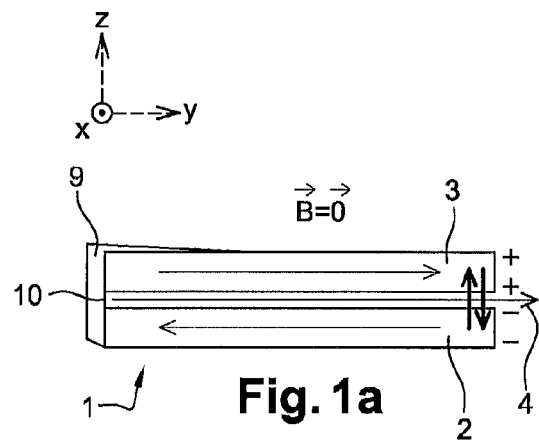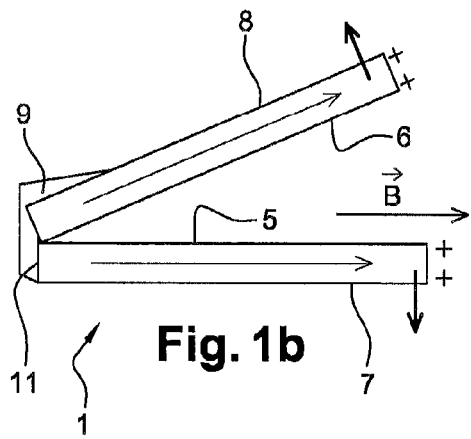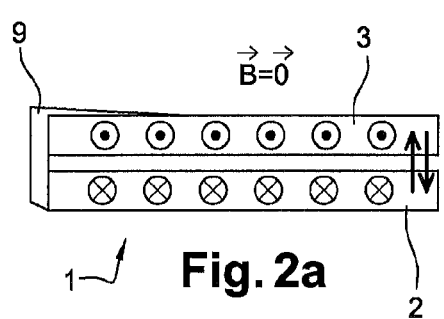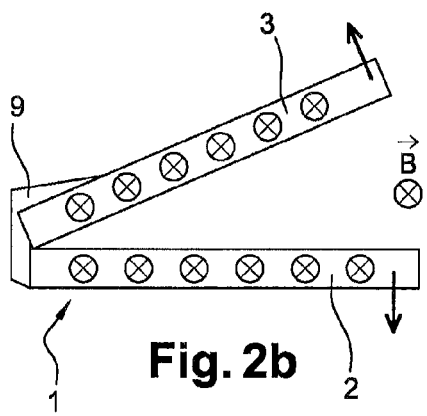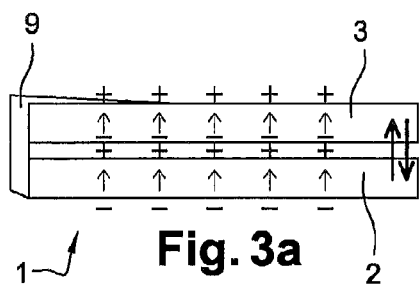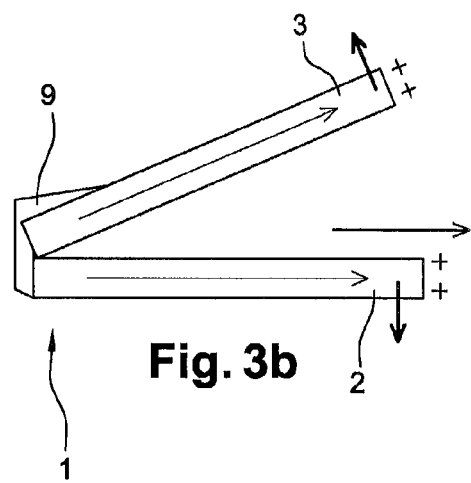

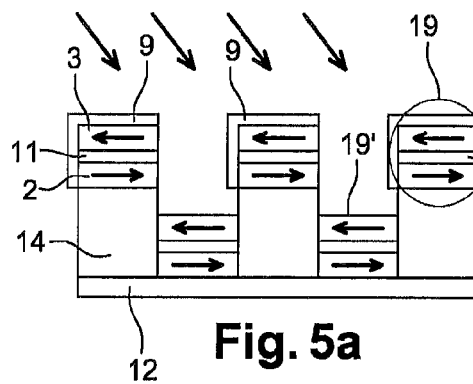
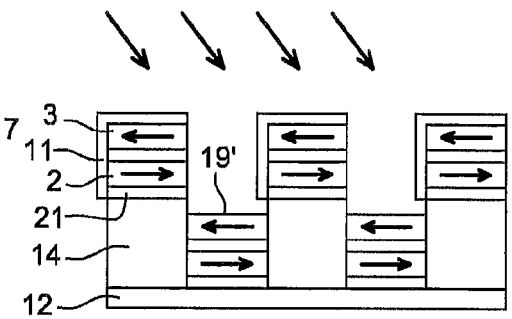
Fig. 5a
Fig. 5b
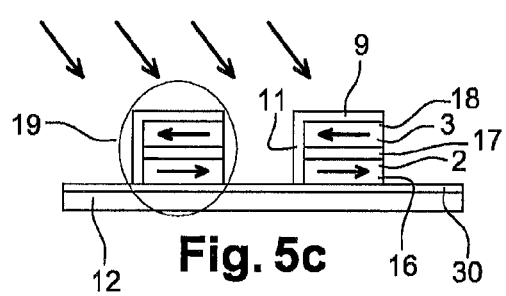
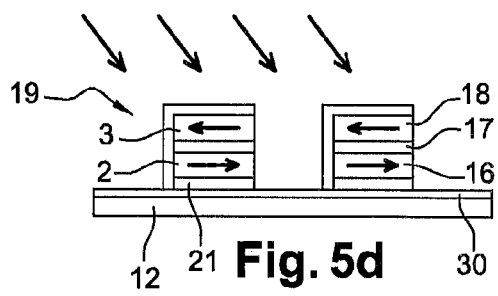
Fig. 5c
Fig. 5d
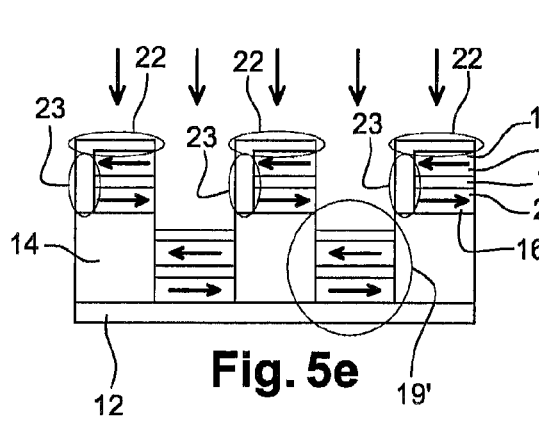
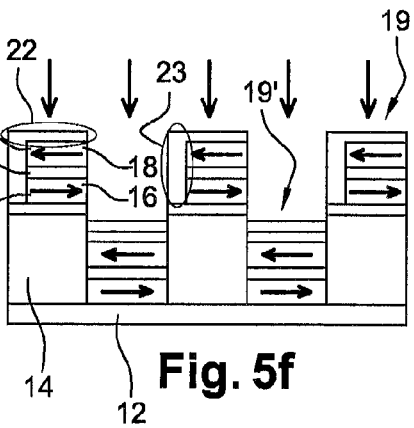
Fig. 5e
Fig. 5f
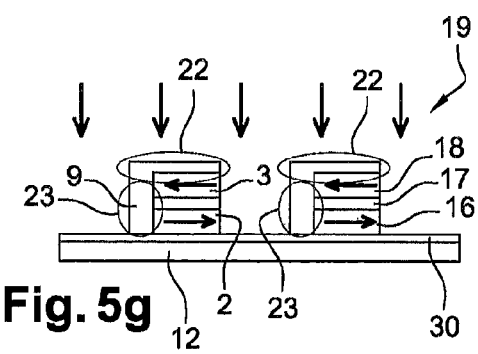
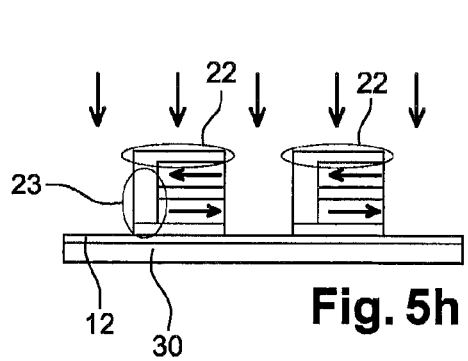
Fig. 5g
Fig. 5h

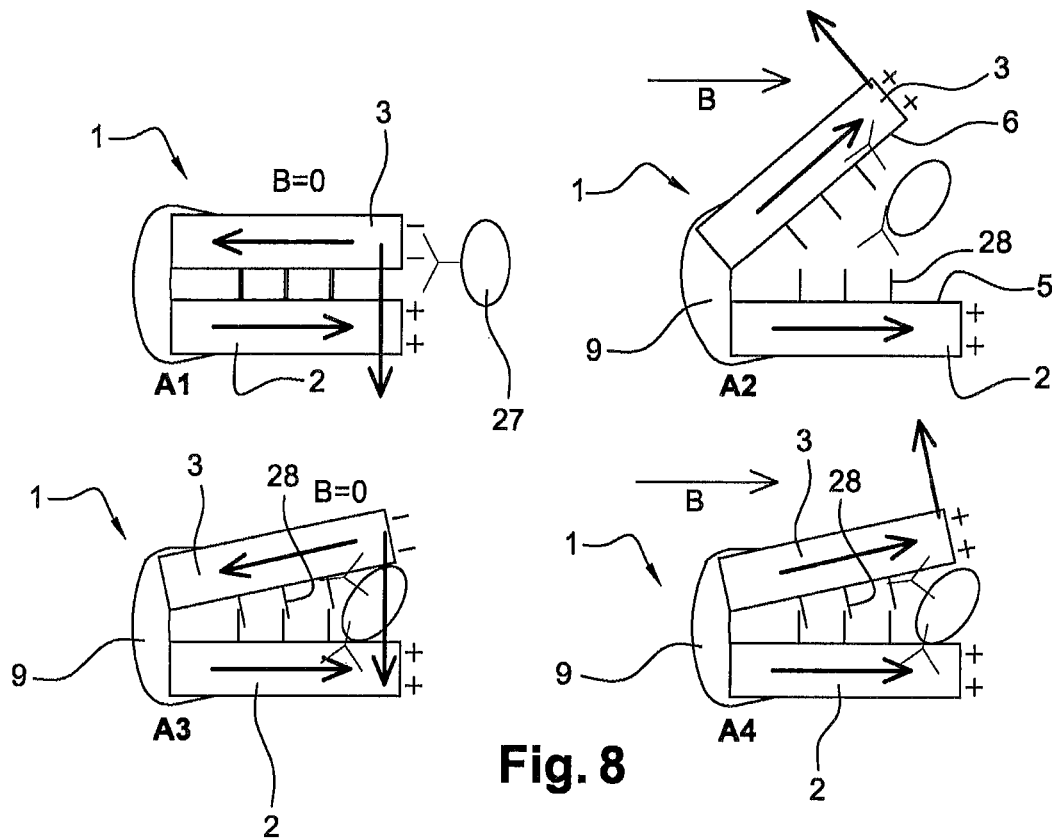
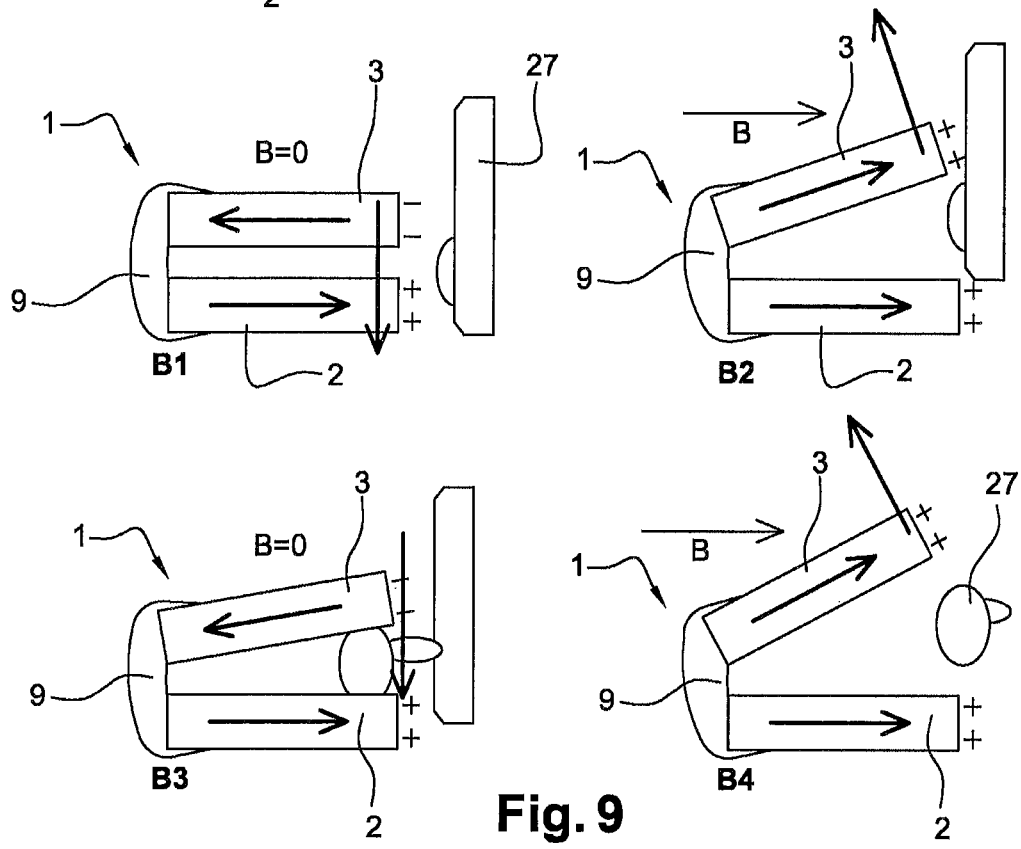
Fig. 8
Fig. 9

PROCESS FOR FABRICATING A MAGNETIC TWEEZER

CROSS-REFERENCE TO RELATED APPLICATIONS

This is the U.S. National Stage of PCT/EP2011/063403, filed Aug. 3, 2011, which in turn claims priority to French Patent Application No. 1056447, filed Aug. 4, 2010, the entire contents of all applications are incorporated herein by reference in their entireties.

The present invention relates to a magnetic tweezer of microscale or nanoscale size and a process for fabricating such tweezer. The present invention also relates to the use of such magnetic tweezer.

Magnetic micro- or nanoparticles are increasingly used in biotechnology or biomedical applications. The publication entitled "Applications of magnetic nanoparticles in biomedicine," Q. A. Pankhurst, J. Connolly, S. K. Jones, J. Dobson, UK, Australia, J. of Phys. D: Appl. Phys. 36, R167-R181, 2003, for example describes the use of magnetic particles in the biomedical field. Interest in these types of particles resides in the possibility to remotely exert a force on these particles by applying a magnetic field. This mechanical action may enable the microparticles to be guided during their displacement, to concentrate them in certain locations, to deform them or magnetically excite them so that they dissipate energy and become heated or else to cause them to vibrate. The document entitled "Heating ability of magnetite nano-beads with various sizes for magnetic hyperthermia at 120 kHz, a non invasive frequency," K. Okawa, M. Sekine, M. Maeda, M. Tada, M. Abe, N. Matsushita, K. Nishio, H. Handa, Tokyo Inst. Tech, Japan, J. of Appl. Phys. 99, 08H102, 2006, for example describes the use of magnetic particles to produce heat.

By utilizing magnetic particles alone or by grafting different types of molecules onto their surface, enabling recognition of certain molecular or cellular species and/or an action on these species, numerous applications are possible. Among these applications may be cited the targeted delivery of treatment molecules (drug delivery), the separating of molecules or cells in suspension, cancer treatments by hyperthermia, cell tissue engineering or use as contrast media in MRI, etc.

Until now, the magnetic particles cited above for biotechnologies have been essentially developed for their capability to be displaced in fluid by the action of a magnetic field gradient. For example, for targeted medication delivery biomedical or biological applications (drug delivery), or molecular separation in solution applications, magnetic particles are utilized to be displaced and guided in the fluid by using external magnetic field gradient sources. For certain biomedical applications such as for cell tissue engineering, the objective is to pull and guide the biological objects grafted onto the magnetic particles.

But in all the previously described cases, the magnetic particles are formed by a simple volume, not very mechanically deformable, that may only be transported as a rigid block.

On the other hand, the prior art has seen magnetic micro-tweezers of the MEMS (Microelectromechanical Systems) type emerge, that may be activated under the action of a magnetic field. The publication entitled "A novel under water actuator driven by magnetization repulsion/attraction," Han-Tang Su, Tsung-Lin, Tang, W. Fang, Nat. T. H. Univ., Hsin-Chu, Taiwan, 1051-1054, IEEE 2009, for example describes magnetic micro-tweezers comprising two parallel tabs, fixed to a support. Under the action of a magnetic field, these tabs deform so that they move towards or away from each other. These two tabs may therefore grip objects on their edges.

These magnetic micro-tweezers are particularly advantageous since they may enable objects to be gripped remotely and objects to be delivered remotely, even in a liquid medium.

However, these magnetic tweezers present relatively large dimensions (in fact their tabs measure approximately 600 µm). In addition, the prior art does not know the process enabling these tweezers to be miniaturized.

In addition, these tweezers may only function fixed to a substrate, which limits their use, and the prior art does not include a process of fabricating micro-tweezers enabling the release of micro-tweezers from the substrate.

In addition, the fabrication of these tweezers is relatively complicated and difficult to automate.

In addition, the magnetic tweezers from the prior art are such that, while remaining fixed to a support, the relative positions of the two parts of these magnetic tweezers are in a fixed configuration: either with two branches parallel to the substrate and in the same plane, that pinch objects with their edge, hence a small surface area to catch an object; Or with two branches that pinch objects by their flat surfaces, but that are connected perpendicularly to the substrate, which is not compatible with a collective fabrication of a set of flat particles collectively obtained by microelectronic techniques.

The invention aims to remedy the disadvantages from the prior art by proposing magnetic particles that are as small as the magnetic particles usually used in the biomedical field but that are deformable in a controlled manner.

The invention also aims to propose magnetic tweezers of micrometric or nanometric size smaller than the size of the magnetic tweezers from the prior art.

Another object of the invention is to propose magnetic micro-tweezers or nano-tweezers that may be detached from the substrate and function in suspension in a solution.

Another object of the invention is to propose micro-tweezers or nano-tweezers that may be displaced in solution under the action of a magnetic field.

Another object of the invention is to propose micro-tweezers or nano-tweezers that present a large gripping surface.

To do this, a magnetic tweezer comprising two jaws, each formed by at least one magnetic thin layer, is proposed according to a first aspect of the invention, the two jaws extending along a longitudinal direction, the two jaws being magnetostatically coupled, the two jaws being connected to each other by a deformable hinge, the hinge extending along a transverse direction, the two jaws may be moved one with relation to the other under the action of a magnetic field.

"Thin layer" is understood to refer to any layer of material deposited by technologies used in micro- or nanoelectronics such as electrodeposition, evaporation, etc. The range of possible thicknesses depends on the limits of existing technologies, evolving with technique, currently situated between a tenth of a nanometer to several tens of micrometers, and usually between one nanometer and a few micrometers.

The longitudinal direction is also subsequently called the Y direction. The transverse direction is perpendicular to the longitudinal direction. Subsequently, the transverse direction will also be called the Z direction.

Therefore, the magnetic tweezer according to the invention is constituted of at least two magnetic thin layers that are mobile with relation to each other and connected by one of their sides by a deformable hinge, preferably elastically. It is the capacity of this transverse hinge to be deformed that enables the angle formed by the jaws of the magnetic tweezer to be opened or closed.

The hinge according to the invention preferably connects the jaws only between each other and not to a support. The magnetic tweezer according to the invention may therefore be used independently of any support.

In this document, the surface of the jaw that does not face the other jaw is called the "outer surface of a jaw." Conversely, the surface of the jaw that faces the other jaw is called the "inner surface of a jaw." The side of the jaw or of the tweezer that is normal to the longitudinal direction on which the hinge is found is called the "lateral edge" of one of the jaws or of the tweezer. The other side of the jaw or of the tweezer on which the hinge is not found is called the "edge" of one of the jaws or tweezer.

The magnetic tweezer according to the invention may also present one or more of the characteristics below, considered individually or according to all technically possible combinations.

Advantageously, the magnetic tweezer according to the invention is a micro-tweezer or a nano-tweezer, i.e., it presents micrometric or nanometric dimensions.

Advantageously, each of the jaws presents a length of less than 0.5 mm, preferably less than 200 μm.

According to a preferential embodiment, the magnetic tweezer comprises a nanoparticle, i.e., each of the three dimensions is between 0.2 and 300 nanometers.

Each jaw may be formed by a single magnetic thin layer or by several magnetic thin layers, or even by a stack of layers itself comprising magnetic thin layers.

According to different embodiments, the two jaws may be constituted either of the same magnetic material, or of two different magnetic materials, each of these magnetic materials may be hard or soft from the magnetic viewpoint. Each of the jaws may be formed by a monolayer or by multilayer.

According to a preferential embodiment, at least one of the jaws is formed in a soft magnetic material. In fact, if the 2 jaws are in hard magnetic materials, magnetostatic. activation of the tweezer will be obtained by applying a higher magnetic field than the coercive fields of the materials, therefore this magnetic field will be bigger than in the case where the two jaws are formed of a soft magnetic material.

When at least one of the jaws comprises a soft magnetic material, this magnetic material may, according to an embodiment, be in Permalloy, which is an NiFe alloy of composition close to 80% Ni and 20% Fe, or other soft alloys based on Ni, Fe and Co (for example $CO_{90}Fe_{10}$).

When at least one of the jaws comprises a hard magnetic layer, this hard magnetic layer may be, according to different embodiments:

in a rare earth/transition metal alloy (for example SmCo), or a magnetic multilayer, for example constituted of the combination of an antiferromagnetic layer coupled with a soft ferromagnetic layer pinned by exchange anisotropy, this antiferromagnetic/ferromagnetic bilayer may be repeated several times.

Advantageously, the thin layers that form the jaws present very well defined uniaxial magnetic anisotropy, i.e., they present a preferred orientation axis for magnetization. According to an embodiment, the anisotropy axis may for example be in the plane of the magnetic layers, along the longitudinal direction or its perpendicular, or be perpendicular to the plane of the layers along the transverse direction. According to another embodiment, one or more anisotropy axes may be defined along different directions in each jaw. Therefore, the anisotropy axis of a first jaw may for example be defined along a first direction, the anisotropy axis of the second jaw being defined along a second direction, the first and second directions being symmetrical with relation to the bisector plane of the angle between the jaws.

The origin of the anisotropy of the thin layers that form the jaws may be diverse: it may be of magnetostatic, magnetocrystalline, magnetoelastic, etc., origin.

Such uniaxial anisotropy may be carried out by depositing magnetic materials under magnetic field. For example, layers of $Ni_{80}Fe_{20}$ Permalloy present such uniaxial anisotropy when they are deposited under magnetic field. Uniaxial anisotropy may also be induced by depositing the magnetic material on a substrate in oblique projection. The magnetic layer then presents uniaxial anisotropy in the plane of the layer, perpendicular to the plane of incidence of the species deposited. Multilayer stacks may also be made presenting uniaxial anisotropy perpendicular to the plane of the layers. For example, this is the case with multilayers (Pt 2 nm/Co 0.6 nm)$_n$. In this type of multilayer, out-of-plane anisotropy exists, of crystallographic or interfacial origin that may exceed the shape anisotropy of magnetostatic origin. In thin layers, shape anisotropy tends to maintain the magnetization of magnetic layers in their plane. But in multilayers (Pt/Co), the perpendicular anisotropy of interfacial origin manages to overcome the shape anisotropy so that the magnetizations of cobalt layers point perpendicularly to the interfaces. These systems therefore present a very well defined uniaxial magnetic anisotropy perpendicular to the plane of the layers.

According to different embodiments, the jaws may:

present antiparallel magnetic coupling when no magnetic field is applied. In this case, when no magnetic field is applied, the magnetic tweezer is closed. On the contrary, when a magnetic field is applied with an intensity equal to or greater than one of the coercive fields of one of the magnetic materials of the tweezer, this magnetic field moves a projection of magnetization of the jaws parallel to the applied field, pointing in the same direction, which induces an attraction of magnetostatic origin between the two jaws, and therefore opening of the tweezer; the antiparallel magnetic coupling is preferably directed along the longitudinal direction, although any other orientation may be contemplated, or present parallel magnetic coupling when no magnetic field is applied. In this case, when no magnetic field is applied, the two jaws repel each other, such that the magnetic tweezer is opened. Conversely, when a magnetic field is applied, the two jaws attract each other, such that the magnetic tweezer is closed.

According to an embodiment, at least one of the jaws is covered, at least partially, with a material capable of being functionalized, in a location where chemical or biological species may be grafted.

"Material capable of being functionalized" is understood to be a material on which chemical or biological species may be grafted. When one wishes to graft biological molecules onto the jaws, this functionalizable material may for example be gold or silica.

According to another embodiment, each jaw is covered, at least partially, with a biocompatible material. When the magnetic tweezer is intended to be introduced into a biological medium, for example a human or animal body, the magnetic tweezer is preferably entirely covered with a biocompatible material. When the magnetic tweezer is not intended to be introduced into a human or animal body, only the parts of the magnetic tweezer that will be in contact with the biological material may be covered with a biocompatible material. The biocompatible material may, for example, be gold or silica. The biocompatible material preferably forms one or more thin layer(s) on the surface of the magnetic tweezer.

According to an embodiment, the inner surface and/or the outer surface of the jaws is or are functionalized. The chemical or biological species may therefore be grafted onto the outer and/or inner surface of the jaws. This functionalization enables, for example, gripping of certain target chemical or biological species by the magnetic tweezer. In addition, this functionalization may enable the tweezer to not release the target chemical or biological species that it catches, even when the magnetic tweezer is opened while it contains certain species between their jaws. In fact, these target chemical or biological species are bound to the chemical or biological species fixed on the jaws of the magnetic tweezer, such that the target chemical or biological species remain fixed to the chemical or biological species fixed on the jaws of the tweezer despite opening of the tweezer.

Advantageously, the hinge is elastically deformable.

Advantageously, the hinge forms an X axis pivot pin connection plane perpendicular to the longitudinal Y axis and to the transverse Z axis. The jaws are preferably capable of pivoting around this X axis under the effect of a magnetic field thanks to deformation of the hinge. Therefore, when a magnetic field is applied, the jaws pivot with relation to each other thanks to deformation of the hinge: In fact, the ends of the jaws that are integral with the hinge remain fixed or practically fixed, depending on the elasticity of the hinge, while the ends of each of the jaws that are free move away from each other.

According to different embodiments, the hinge may be constituted of:
- an elastically deformable thin layer. This thin layer is preferably made in a ductile metal of the gold, silver, copper or platinum type or any other elastic material having sufficient fatigue strength that is capable of being deposited on the jaws; this elastically deformable layer may be metallic or not, possibly magnetic;
- the molecular, chemical or biological elements that connect the two jaws of the magnetic tweezer together. In the case where the hinge is formed of biological elements (for example by strands of DNA, RNA, antibodies, antigens, etc.), a biocompatible layer (Au, $SiO_2$, etc.) May be deposited on the lateral edge of the jaws to enable these biological elements to be grafted onto the lateral edge of the jaws.

According to different embodiments, the elastically deformable thin layer that constitutes the hinge may cover:
- both the outer surface of the two jaws and the lateral edge of the two jaws. In this case, the hinge surrounds the two jaws of the magnetic tweezer. Such a hinge is particularly advantageous when the jaws will carry out large movements with relation to each other; or
- the outer surface of one of the jaws and the lateral edge of the two jaws. In this case, the hinge only surrounds one of the jaws and the lateral edge of the two jaws, or
- the lateral edge and a part of the outer surface of at least one jaw
- only the lateral edge of the two jaws.

According to different preferential embodiments of the invention:
- the hinge is formed by one deformable thin layer in organic materials, in polymer or in resin that is resistant to the solvents used for the sacrificial layers; or
- the hinge is formed of silica. Another object of the invention is to propose a process enabling the fabrication of magnetic tweezer of all shapes and sizes, including magnetic tweezer of nanometric size.

Another object of the invention is to propose a process enabling the simultaneous fabrication of a large number of magnetic micro- or nano-tweezers.

Another object of the invention is to propose a process enabling a large number of micro- or nano-tweezers to be easily fabricated.

To do this, according to a second aspect of the invention, a process of fabricating a magnetic tweezer according to the first aspect of the invention, on the surface of a substrate, is proposed, the process comprising the following steps:
(i)—formation of a stack on the surface of the substrate, the stack comprising at least two magnetic thin layers between which a sacrificial layer is found, the two thin layers being magnetostatically coupled, the stack presenting a longitudinal section equal to the desired longitudinal section for the magnetic tweezer to be fabricated, the stack presenting a lateral edge;
(ii)—deposition of a hinge onto at least the lateral edge of the stack;
(iii)—attack and elimination of the sacrificial layer.

Therefore, the fabrication process according to the invention is particularly remarkable in that a sacrificial layer is deposited between the thin layers that form the jaws, so as to maintain the two jaws together but at a distance as long as the hinge has not been deposited. The hinge then maintains the two jaws together, and the sacrificial layer may then be dissolved.

Each jaw is formed by one of the magnetic thin layers of the stack. These magnetic thin layers present magnetic coupling through the sacrificial layer. Therefore, the thin layers and the sacrificial layer are chosen such that the thin layers present magnetic coupling through the sacrificial layer, i.e., the materials that constitute the magnetic thin layers and the sacrificial layer as well as the thickness of these layers, and the deposition conditions of these layers, are chosen so as to obtain this coupling.

For example, the magnetic thin layers of the stack may be deposited under a magnetic field.

Advantageously, the two jaws of the tweezer, each formed by one of the thin layers, extend parallel to the surface of the substrate. The hinge extends perpendicularly to the surface of the substrate.

Each jaw may also be formed by several magnetic thin layers and in this case, the stack comprises several thin layers on each side of the sacrificial layer.

The stack may also comprise at least one layer of biocompatible material.

The stack may also comprise at least one layer of functionalizable material.

Advantageously, the stack produced in step (i) forms a nanoparticle constituted of two magnetic thin layers between which a sacrificial layer is found.

The stack produced in step (i) preferably presents dimensions of less than 300 nm.

The sacrificial layer maintains the two magnetic layers that form jaws together but at a distance from each other as long as the hinge has not been deposited.

The hinge is then deposited on the lateral edge of the stack.

The process according to the invention may also comprise, following step (iii), a step of opening the jaws of the tweezer and grafting chemical or biological species inside the jaws of the magnetic tweezer.

The process according to the invention may also comprise, following step (iii), a step of separating the magnetic tweezer from the substrate by attack and eliminating a support layer that separates the magnetic tweezer from the substrate.

Step (i) of producing the stack may be carried out according to different embodiments.

According to a first embodiment, step (i) comprises the following steps:
- formation of at least one relief on the surface of the substrate, the relief presenting an upper surface of longitudinal section equal to the desired longitudinal section for the magnetic tweezer to be produced;
- deposition of at least one first magnetic thin layer on the upper surface of this relief;
- deposition of a sacrificial layer on the first thin layer;
- deposition of at least one second magnetic thin layer on the surface of the sacrificial layer.

According to this first embodiment, the surface of the substrate is prestructured so as to form a mold in which the different layers that constitute the stack are deposited. The longitudinal section of the stack is then defined by the longitudinal section of the relief.

Depending on different embodiments:
- the relief may be formed by one or more pads projecting from the surface of the substrate, these pads being separated by cavities. In this case, the different layers that constitute the stack are deposited on top of this or these pad(s). The top of each pad presents an upper surface of longitudinal section that defines the longitudinal surface of the stack and therefore the longitudinal surface of the magnetic tweezers to be produced;
- the relief may be formed by one or more cavities formed in the surface of the substrate, the cavities being separated by pads. In this case, the different layers that constitute the stack are deposited on the bottom of this cavity or these cavities. The bottom of each cavity presents a surface of longitudinal section equal to the longitudinal surface of the stack and therefore to the longitudinal surface of the magnetic tweezer to be produced. In the case where each stack is formed in a cavity, a support layer is preferably deposited on the surface of the substrate prior to producing the stack so as to be able to then separate the magnetic tweezer from the substrate by elimination of this support layer. This support layer is preferably able to be easily dissolved by using a solvent.

This process enables magnetic tweezers of any size and shape to be fabricated, since the relief at the surface of the substrate defines the shape and dimensions of the tweezers.

According to a second embodiment, step (i) of producing the stack comprises the following steps:
- a support layer is deposited on the substrate;
- a first set of pads and cavities is formed on the surface of the support layer, each cavity presenting a bottom of longitudinal section equal to the desired longitudinal section for the lower jaw of the magnetic tweezer to be produced;
- at least one first magnetic thin layer is deposited;
- the first set of pads and cavities is eliminated by etching;
- a sacrificial layer is deposited such that the upper surface of the sacrificial layer is flat and the first thin layer is entirely covered by the sacrificial layer;
- at least one second set of pads and cavities is formed on the surface of the sacrificial layer, each cavity presenting a bottom of longitudinal section equal to the desired longitudinal section for the upper jaw of the magnetic tweezer to be produced;
- at least one second magnetic thin layer is deposited;
- the second set of pads and cavities and the part of the sacrificial layer that is found outside the stack are eliminated by selective etching so as to only maintain on the support layer the stack of longitudinal section equal to the longitudinal section of the upper jaw of the tweezer to be produced.

Advantageously, the step of depositing a sacrificial layer such that the upper surface of the sacrificial layer is flat may also comprise a step of planarizing the upper surface of the sacrificial layer deposited.

Advantageously, the second set of pads and cavities is identical to the first set of pads and cavities, and is deposited at the same location on the support layer as the first set of pads and cavities.

According to an embodiment, the step of forming at least one relief on the surface of the substrate, the step of forming the first set of pads and cavities and the step of forming the second set of pads and cavities each comprise the following steps:
- a layer of resin is deposited on the surface of the substrate,
- the resin is insolated by lithography to produce at least one relief on the surface of the substrate,
- the insolated parts are eliminated.

The insolated part elimination step may be a step of dissolving the insolated parts thanks to a solvent.

The lithography used may be optical or electronic.

According to another embodiment, the step of forming at least one relief on the surface of the substrate, the step of forming the first set of pads and cavities and the step of forming the second set of pads and cavities each comprise the following steps:
- a layer of resin is deposited on the surface of the substrate,
- pressing a mold containing the impression of the relief to be produced on the resin layer;
- crosslinking of the resin, for example thermally or by UV insolation.

The pressing step is preferably carried out with heat, at a temperature at which the resin is relatively fluid, i.e., at a temperature greater than or close to the glass transition temperature Tg of the polymer constituting the resin. This resin may for example be PMMA or polymethyl methacrylate, heated to approximately 180° C. for pressing.

Advantageously, the resin layer deposited on the surface of the substrate presents a thickness greater than the thickness of the magnetic tweezers to be produced. In this way, the stack that is produced at the top of the relief is physically detached from the stack produced at the bottom of the relief (and conversely).

According to a third embodiment, step (i) comprises the following steps:
- deposition of at least one first magnetic thin layer on the surface of the substrate;
- deposition of a sacrificial layer on the first thin layer;
- deposition of at least one second magnetic thin layer on the surface of the sacrificial layer;
- lithography of the multilayer formed by the first magnetic thin layer, the second magnetic thin layer and the sacrificial layer so as to form a stack presenting a longitudinal section equal to the desired longitudinal section for the magnetic tweezer to be produced.

According to this third embodiment, a multilayer is first produced over the entire surface of the substrate, and then this multilayer is cut so as to only maintain a part of the multilayer that presents the desired longitudinal section. The lithography used may be optical or electronic.

In this case, when one wishes to make magnetic tweezers in solution, the upper surface of the substrate is covered by a support layer, that is sacrificial, and the process also comprises a step of separating the magnetic tweezer from the substrate by attack and elimination of the support layer.

The steps of depositing magnetic layers, the sacrificial layer, and the hinge when it is formed of a single layer, are for example carried out by cathode sputtering, but they may also be carried out by molecular beam epitaxy, electrodeposition or ALD (Atomic Layer Deposition).

Advantageously, the steps of depositing the first and second thin layers of the stack are carried out under a magnetic field such that the first and second thin layers present uniaxial magnetic anisotropy aligned on this field.

Step (i) of forming the stack may also comprise one or more steps of depositing a layer of biocompatible material. For example, when it is desired that the outer surface of the first jaw be covered with a biocompatible material, the step of depositing the first thin layer in magnetic material is preceded by a step of depositing a layer in a biocompatible material, for example in gold or silica. If it is desired that the inner surface of the first jaw be covered with a biocompatible material, the step of depositing the first thin layer in magnetic material is followed by a step of depositing a layer in a biocompatible material. If it is desired that the inner surface of the second jaw be covered with a biocompatible material, the step of depositing the second thin layer in magnetic material is preceded by a step of depositing a layer in a biocompatible material. If it is desired that the outer surface of the second jaw be covered with a biocompatible material, the step of depositing the second thin layer in magnetic material is followed by a step of depositing a layer in a biocompatible material.

When the hinge is formed by a thin layer, it may be deposited according to several embodiments.

According to a first embodiment, the hinge deposition step is carried out in oblique incidence to cover both the lateral edge of the jaws and at least one part of the upper surface of the second jaw. In this case, the step of depositing the material that constitutes the hinge is for example carried out by cathode sputtering, PVD, CVD, ADL, electrodeposition, molecular beam epitaxy, etc.

According to another embodiment, the side of the hinge that is defined as being the part of the hinge that is perpendicular to the substrate may be formed by a pillar defined by optical or electronic lithography, the material constituting the pillar being deposited in incidence perpendicular to the plane of the substrate. In this case, the hinge may also comprise a part that surrounds the outer surface of the second jaw (i.e., the jaw farthest from the substrate).

In this case, the upper part of the hinge that covers the surface of the second jaw may be produced by deposition at normal incidence. The terms "normal incidence" and "incidence perpendicular to the substrate" are equivalent.

The hinge may also comprise a part that surrounds the outer surface of the first jaw (i.e., the jaw that is the closest to the substrate) and in this case, the process according to the invention comprises, prior to step (i), a step of depositing a layer constituting the part of the hinge that surrounds the first jaw.

When the hinge is formed of molecules that connect the two jaws, the step of producing the hinge is preferably carried out by grafting molecules that constitute the hinge onto the lateral edge of the jaws.

When the hinge connects the first and the second jaws, the jaws are released from each other by attacking and eliminating, for example by dissolving by using a suitable solvent, the sacrificial layer, or by destroying the sacrificial layer by isotropic plasma or anisotropic etching.

The tweezer according to the invention and the tweezer fabricated by using the process according to the invention is particularly advantageous since, by playing on the magnetic field applied, one may grip an object by using the tweezer, grasp it, hold it locked, or release a molecule or a biological object at a precise location.

The tweezer according to the invention therefore enables an object to be handled remotely by playing on the magnetic field applied.

In addition, the magnetic tweezer according to the invention may be in suspension in solution and in this case, they may be displaced in a controlled manner in the solution thanks to the application of a magnetic field of chosen intensity and frequency. The magnetic control of the displacement of the tweezer in solution, in vitro or in vivo, may be obtained by an applied magnetic field gradient and/or by an applied magnetic field that is variable over time.

The magnetic micro- or nanotweezer according to the invention may therefore be used for biotechnologies and biomedical purposes, but also in microrobotics, nanomechanics, nanoptics, etc.

The invention also relates to the use of the magnetic tweezer according to the invention to grip an object remotely. In this case, a magnetic field is applied so as to open the magnetic tweezer and close them again on said object.

The invention also relates to the use of the magnetic tweezer according to the invention to transport an object in a liquid. In this case, once the magnetic tweezer has gripped the object between its jaws, a magnetic field gradient may be applied so that the magnetic tweezer is displaced in the liquid. The tweezer may also be displaced by non-magnetic means. For example, it may be driven by a is fluid in movement.

The invention also relates to the use of a tweezer according to the invention to measure the molecular bond strength of a chemical or biological species presenting two ends. In this case, each end of the species is fixed to one of the jaws of the magnetic tweezer according to the invention, and the strength of the chemical or biological species is measured by the magnetic field necessary to open the magnetic tweezer despite the presence of the chemical or biological species fixed to the jaws of the tweezer. The magnetostatic repulsion or attraction force that opens or closes the tweezer depends on the properties of the magnetic materials constituting the jaws, their saturation magnetization, their magnetic behavior according to the field applied, the intensity and frequency of the magnetic field applied, and the volumes of magnetic materials.

The invention also relates to the use of the magnetic tweezer to measure the molecular bond strength between two chemical or biological species, each species being fixed to one of the jaws of the magnetic tweezer. The strength necessary to open the jaws of the magnetic tweezer and therefore the strength necessary to separate the two species from each other are then determined. To do this, the magnetic field necessary to open the jaws of the magnetic tweezer despite the presence of two species between the jaws of the magnetic tweezer is determined, and then the strength necessary to separate the two species from each other is deduced.

The invention also relates to the use of several magnetic tweezers according to the invention to modify the reflectivity of a surface. In this case, the magnetic tweezers are fixed to the surface such that the lower jaw of each magnetic tweezer is parallel to the surface and a magnetic field is applied so as to activate the upper jaw of the magnetic tweezers, which enables the reflectivity of the surface that supports the tweezers to be varied. In this case, the outer surface of the second jaw of the tweezers may be covered with a very reflective material. To obtain magnetic tweezers according to the invention fixed to the surface of a substrate, it is sufficient to not separate the magnetic tweezers from their support and therefore the lower jaw remains fixed to the substrate and the upper jaw may be activated by an applied magnetic field.

The invention also relates to the use of a magnetic tweezer according to the invention to heat an object held between the jaws of the magnetic tweezer.

In this case, the magnetic tweezer holds the object between these jaws and are subjected to a magnetic field at a sufficiently high frequency to cause the tweezer to be heated, i.e., preferably a frequency of between a few tens and a few hundreds of kilohertz. The orientation of the magnetic field enabling heating of the tweezer depends on the materials used for the jaws of the magnetic tweezer.

The alternating magnetic field applied to the magnetic tweezer in this case preferably presents an amplitude of approximately one one-hundredth of a tesla. The alternating magnetic field applied in this case presents an orientation able to open and close the magnetic tweezer. For example, when the jaws of the magnetic tweezer present antiparallel coupling along the Y direction, the magnetic field is directed along the Y direction. When this alternating magnetic field is applied in the region of the space where the magnetic tweezer is found, the magnetic tweezer remains closed, filtering high frequencies from the mechanical point of view, while heating itself, and they then will form a sort of "oven" surrounding the captured object.

The invention also relates to the use of the tweezer according to the invention to cause an object held between the jaws of the magnetic tweezer to vibrate, the magnetic tweezer being subjected to a magnetic field at a frequency capable of causing vibration of the tweezer.

The invention also relates to a process of displacing the magnetic tweezer according to the invention, the magnetic tweezer being in suspension in a liquid, the magnetic tweezer being subjected to a magnetic field with a sufficiently low frequency, i.e., preferably between a few hertz to a few hundreds of hertz, to cause the jaws of the tweezer to perform small strokes, which leads to translation of the magnetic tweezer in the solution. In fact, the act of applying to the tweezer an alternating magnetic field at a relatively low frequency enables small strokes of the jaws of the magnetic tweezer to be created, which enables them to "swim" and therefore be displaced in the solution.

If a magnetic field gradient is superimposed on this alternating magnetic field, this "butterfly" effect will facilitate the displacement of the magnetic tweezer along the direction and sense imposed by the gradient.

In addition, this "swimming" effect may also enable displacement of the magnetic tweezer without a magnetic field gradient. In fact, when the magnetic tweezer is in solution, if the frequency of the magnetic field is between 1 Hertz and a few hundred Hertz, so as to periodically activate the complete openings and closings of the jaws of the magnetic tweezer, depending on the viscosity of the solution and the shape of the magnetic field applied, a "swimming" effect of the tweezer may be caused, which will enable the particle to be displaced without a field gradient applied, in remote zones where a field gradient would be difficult to obtain. So that this alternative opening and closing leads to a translation movement of the magnetic tweezer, it is necessary that the magnetic field alternatively varies in an asymmetrical manner: Thus so that the tweezer advances from the side of the hinge, it is necessary that the closing of the tweezer is faster than their opening, in the manner of a scallop. Conversely, so that the magnetic tweezer goes in the direction opposite from that of the hinge, the opening must be faster than the closing. If the tweezers are oriented in different directions, this "swimming" effect will enable them to be separated from each other.

Figure 4B:
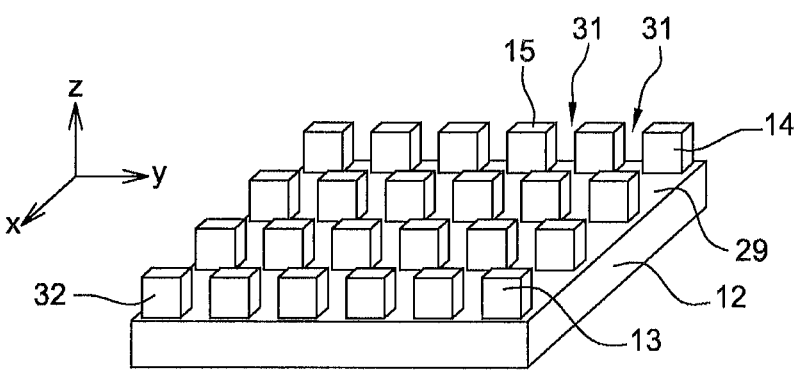
Figure 4C:
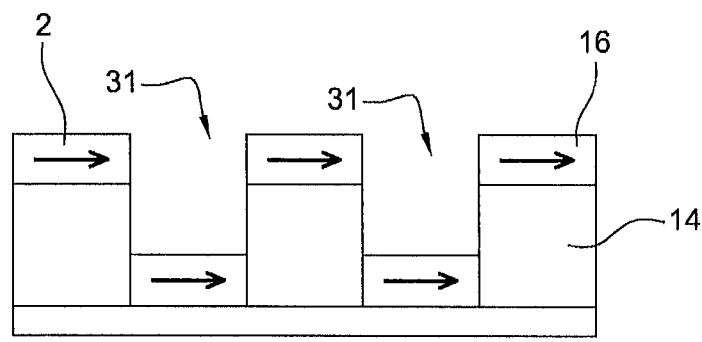
Figure 4D:
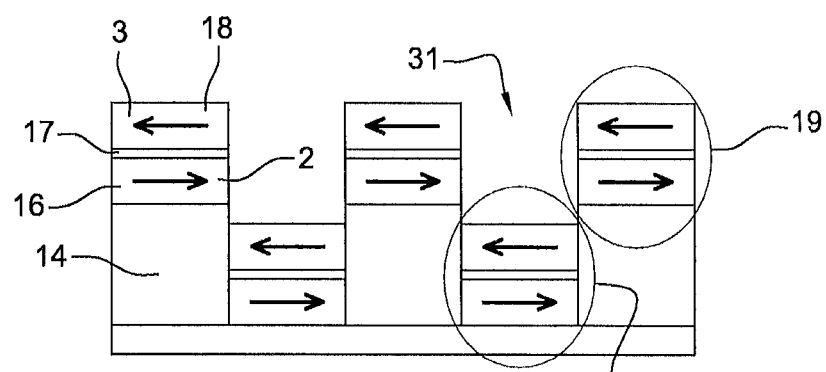
Figure 4E:
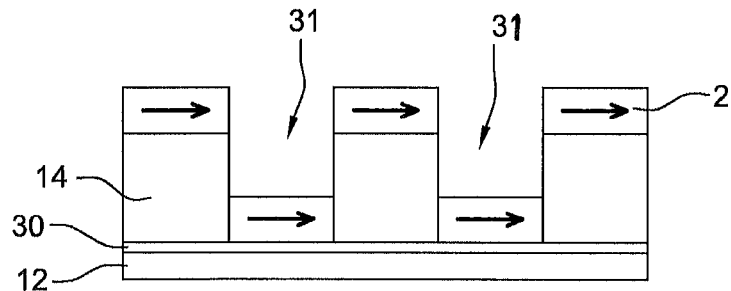
Figure 4F:
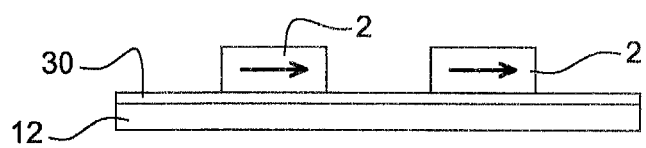
Figure 4G:
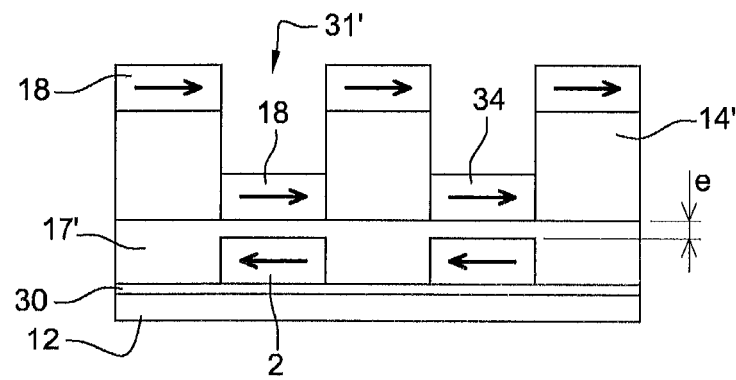
Figure 4H:
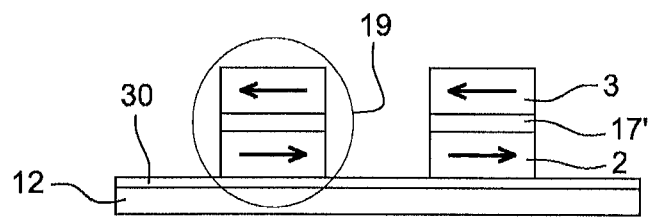
Figure 4I:
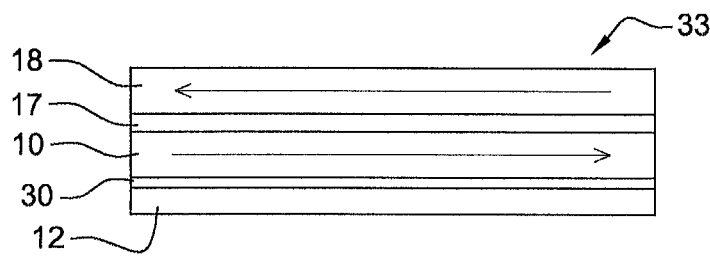
Figure 4J:
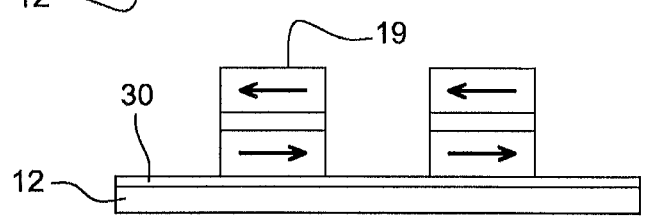
Figure 6:
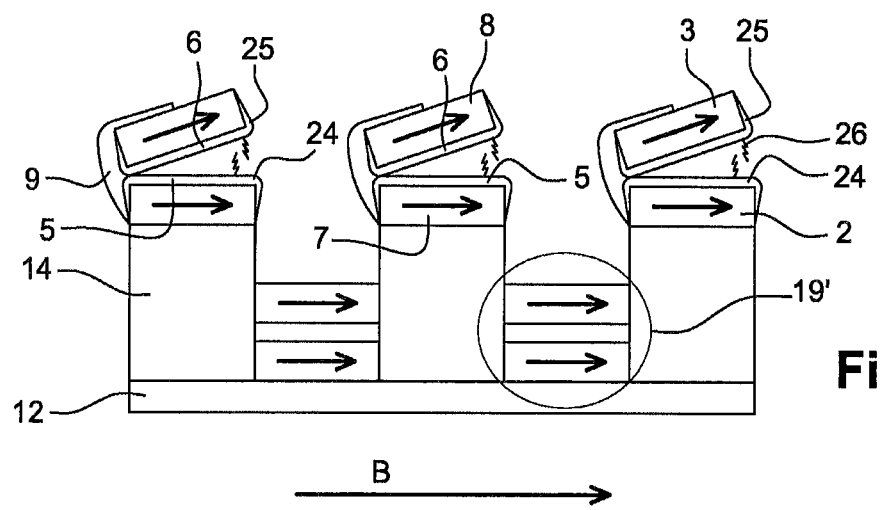
Figure 7:
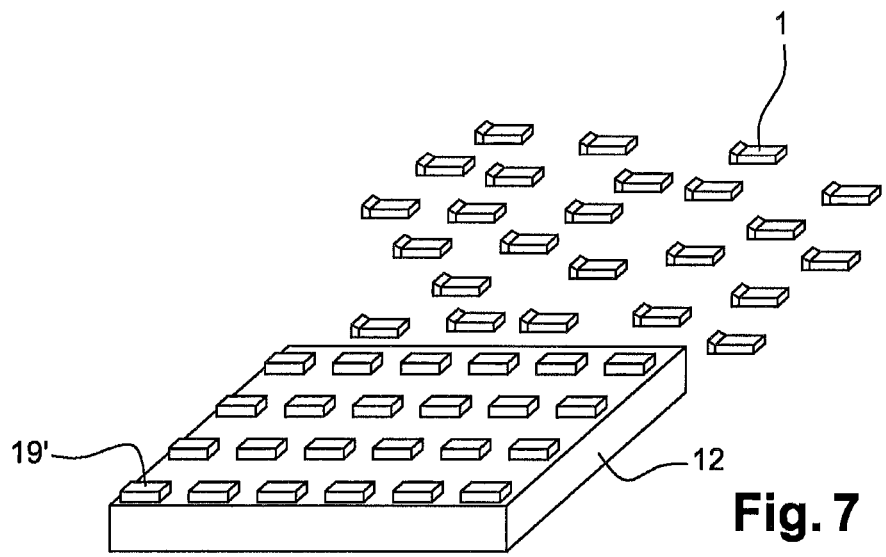
Figure 10:
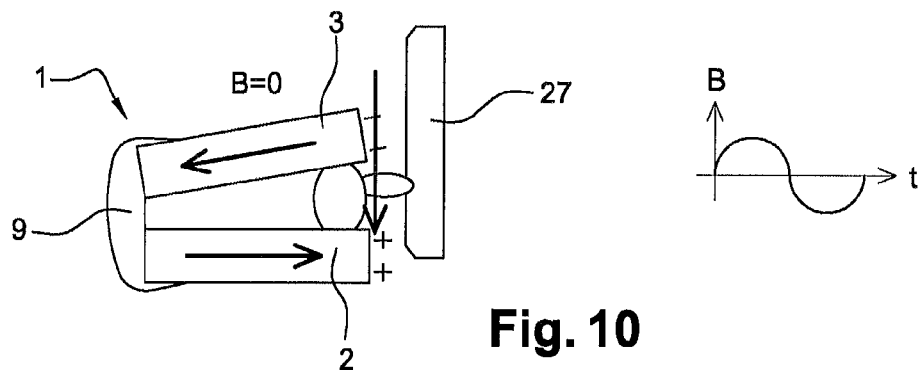
Figure 11:
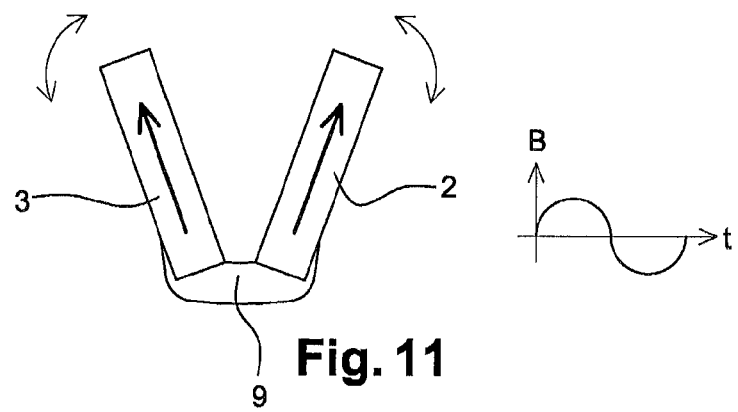
Figure 12:
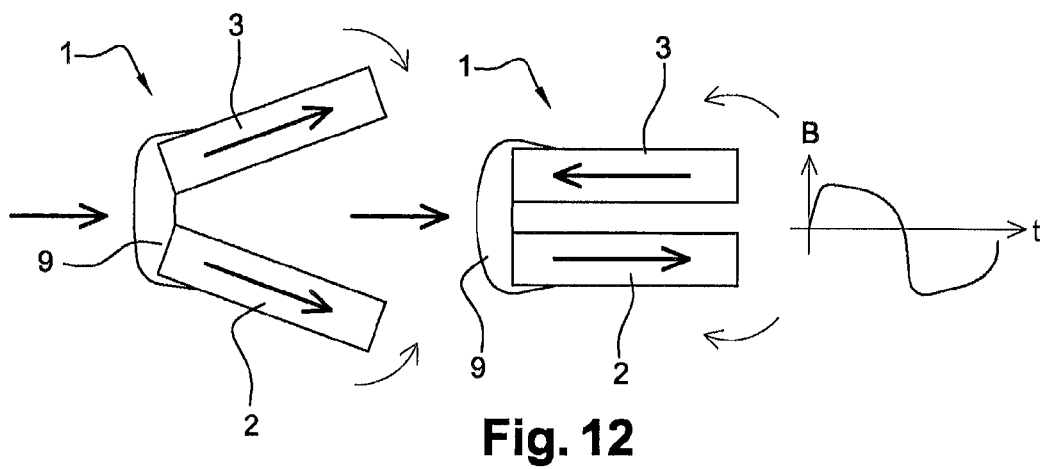

Other characteristics and advantages of the invention will emerge upon reading the following description, with reference to the attached figures, that illustrate:

FIGS. 1a and 1b, a cross sectional view of magnetic tweezer according to an embodiment of the invention, respectively in closed and open position, FIGS. 2a and 2b, a cross sectional view of magnetic tweezer according to another embodiment of the invention, respectively in closed and open position, FIGS. 3a and 3b, a cross sectional view of magnetic tweezer according to another embodiment of the invention, respectively in closed and open position, FIG. 4a, a schematic view in cross section of a stack enabling magnetic tweezer according to the invention to be fabricated;

FIGS. 4b to 4d, schematic representations of the steps of a process enabling the stack from FIG. 4a to be fabricated;

FIGS. 4e to 4h, schematic representations of the steps of another process enabling the stack from FIG. 4a to be fabricated;

FIGS. 4i and 4j, schematic representations of the steps of another process enabling the stack from FIG. 4a to be fabricated;

FIGS. 5a to 5h, schematic representations of the steps of producing the magnetic tweezer hinge according to the invention;

FIG. 6, a sectional view of magnetic tweezers according to the invention that are functionalized;

FIG. 7, a perspective schematic representation of magnetic tweezer according to the invention that are separated from their support;

FIG. 8, a sectional schematic representation of magnetic tweezer according to an embodiment of the invention that is functionalized;

FIG. 9, a sectional schematic representation of magnetic tweezer according to an embodiment of the invention that is used to grip objects;

FIG. 10, a sectional schematic representation of magnetic tweezer according to an embodiment of the invention that are used to heat an object;

FIG. 11, a sectional schematic representation of magnetic tweezer according to an embodiment of the invention that perform small strokes;

FIG. 12, a sectional schematic representation of magnetic tweezer according to an embodiment of the invention that are displaced in a fluid.

For more clarity, identical or similar elements are marked by identical reference signs in all of the figures.

FIG. 1 represents a sectional view of a magnetic tweezer 1 according to an embodiment of the invention.

The magnetic tweezer 1 comprises a first jaw 2 and a second jaw 3. The two jaws 2, 3 extend along a longitudinal axis 4. The two jaws 2, 3 each present an inner surface 5, 6 and an outer surface 7, 8. "Inner surface" designates the surface of a jaw that faces the other jaw and "outer surface" designates the opposite surface. The inner and outer surfaces of each jaw extend parallel to the longitudinal axis 4. Longitudinal axis 4 is parallel to the Y axis.

The magnetic tweezer 1 also comprises a hinge 9 that connects the two jaws together by one of their sides. The hinge extends along the transverse Z axis. The side of the magnetic tweezer by which the hinge connects the jaws is called the "lateral edge" 11. The hinge is preferably formed of a thin metallic film. The metal used to form the hinge may be gold, platinum, silver, copper or any other ductile metal.

In this embodiment, each jaw 2, 3 is formed by a thin layer in a magnetic material. This thin layer is preferably a nickeliron-cobalt alloy of general form $Ni_{1-x-y}Fe_xCo_y$, x and y being real numbers between 0 and 1 characterizing the relative concentrations of Fe and Co in the alloy. The thicknesses of the two jaws are chosen preferentially such that their magnetic moments are comparable. Here this means that the product of magnetization of the jaw by the thickness of the jaw must substantially be the same for the two jaws.

The two jaws 2, 3 present planar uniaxial anisotropy along the Y axis. More precisely, in this embodiment, the magnetostatic interaction between the magnetizations of the two jaws 2 and 3 means that spontaneously, the magnetizations of the two jaws are oriented in an antiparallel manner so that the magnetic flux between the two jaws is closed.

Therefore, in the absence of a magnetic field, as represented in FIG. 1a, the jaws 2, 3 present an almost null magnetic moment since the magnetizations of successive layers that constitute the jaws are antiparallel with relation to each other and their respective magnetic moments are comparable. On the contrary, when a magnetic field B parallel to the Y axis is applied, as represented in FIG. 1b, this magnetic field B moves the magnetizations of the thin layers that constitute the jaws all parallel, which induces a strong magnetostatic repulsion between the two jaws, this magnetostatic repulsion being of the same nature as the repulsion of two bar magnets when poles of the same sign are approached. This repulsion leads to opening of the magnetic tweezer by deformation of the hinge, to enable the jaws to move apart from one another.

Therefore, the opening and closing of the magnetic tweezer 1 may be controlled by controlling the magnetic field that is applied to them.

FIGS. 2a and 2b represent a magnetic tweezer 1 according to another embodiment of the invention. These magnetic tweezer comprises two jaws 2 and 3 interconnected by a hinge 9. Each jaw is formed of at least one magnetic thin layer. The jaws present planar uniaxial anisotropy along the X axis. The jaws present antiparallel magnetic coupling along the X axis of magnetostatic origin. When no magnetic field is applied (FIG. 2a), jaws 2, 3 attract each other by magnetostatic interaction in the manner of two bar magnets when poles of opposite signs are approached. The magnetic tweezer is thus closed. On the contrary, in case a magnetic field B along the X axis is applied, the magnetizations of the jaws become parallel and therefore the jaws repel each other, which leads to opening of the magnetic tweezer (FIG. 2b).

FIGS. 3a and 3b represent another embodiment in which the two jaws 2 and 3 present, in the absence of a magnetic field, out-of-plane uniaxial anisotropy of the layers along the Z axis, which is perpendicular to the magnetic layers. In the absence of an applied magnetic field, the magnetic moments are parallel and placed end to end and consequently, the two jaws attract each other and therefore the magnetic tweezer 1 remains closed. On the contrary, when a magnetic field B parallel to the XY plane is applied, the magnetization of the first and the second jaws becomes parallel between them and to the X, Y plane such that the two jaws repel each other and pivot around the X axis so that the magnetic tweezer opens.

A process of producing magnetic tweezers according to the invention will now be described with reference to FIGS. 4a to 7.

In order to facilitate comprehension of the process, we are placed in the case where the magnetic tweezers that one attempts to produce present two jaws presenting antiparallel magnetic coupling between them along the Y axis in the absence of an applied magnetic field. The magnetic tweezers that one attempts to produce are therefore identical to the magnetic tweezer represented in FIGS. 1a and 1b. The person skilled in the art would know to adapt the process described below to fabricate other magnetic tweezers according to the invention.

According to a first step, a stack 19 comprising two magnetic thin layers, each thin layer forming one of the jaws 2, 3 of the tweezer to be produced, is made first on the surface of a substrate 12. Between these two magnetic thin layers, stack 19 comprises a sacrificial layer 17. This stack 19 must present the same shape as the magnetic tweezer that one attempts to produce.

This stack 19 must comprise at least two magnetic thin layers separated by a sacrificial layer. The sacrificial layer may be metallic, insulating, semiconductor or polymer-based. The sacrificial layer must be able to be selectively eliminated with relation to the thin layers that form the jaws of the magnetic tweezer. Concerning the magnetic layers included in the jaws, stack 19 may be a magnetic layer stack of Ni-, Fe- and Co-based alloys, with a typical thickness of a few tens of nanometers antiferromagnetically coupled by magnetostatic interactions on both sides of the sacrificial layer. This stack may comprise other layers particularly used for the biocompatibility of materials and the functionalization of various surfaces of the tweezer. Such a stack may be produced according to different embodiments.

FIGS. 4b to 4d represent a first embodiment of such a stack 19.

In this first embodiment, one starts off with a substrate 12 with a smooth surface, for example in silicon.

A layer of polymer resin with a homogeneous thickness is then deposited on the surface of this substrate 12.

The polymer resin layer of homogeneous thickness may for example be obtained by a spin coating process. The principle consists of laying, by using centrifugal forces, a small quantity of polymeric resin on the substrate, for example by using a spinner that suctions the wafer so that it is not ejected during rotation.

The polymer resin layer of homogeneous thickness may also be obtained by resin evaporation or spray coating.

The thickness of this polymer layer may be a few tens of nanometers to several microns.

The thickness of the polymer resin layer must be greater than the thickness of the magnetic tweezers that one attempts to produce, such that the deposition carried out at the top of the pads is physically separated from that carried out at the bottom of the cavities separating the pads.

Once this polymer layer is spread on the surface of the substrate, reliefs 13 are made in this polymer layer that present a longitudinal section equal to the longitudinal section of the magnetic tweezers that one attempts to produce.

In this example, reliefs 13 that one attempts to produce are rectangular pads 14 that present an upper surface of longitudinal section equal to the longitudinal section of the magnetic tweezers that one attempts to produce.

In this example, pads 14 that one attempts to produce present an upper surface 15 of square longitudinal section with a side length of 1 μm. Of course, other forms of upper surfaces may be produced according to the desired form for the magnetic tweezer to be produced.

These pads 14 are separated by cavities 31 that are sufficiently deep so that the depositions carried out subsequently on the pads are physically separated from the depositions carried out on the bottom of the cavities. The pads 14 present a lateral surface 32 perpendicular to the surface of the substrate. Cavities 31 present a flat bottom 29 parallel to the surface of the substrate 12.

This set of pads 14 and cavities 31 may be produced according to different embodiments.

According to a first embodiment, pads 14 and cavities 31 are produced in the layer of polymer resin by lithography (for example, optical or electronic lithography): this lithography step proceeds by exposure (for example by UV radiation) of a fraction of the polymeric resin layer through a mask comprising a UV radiation transparent part and a UV radiation opaque part defining the patterns of pads 14 to be made; A latent image in the thickness of the photosensitive polymer resin layer is then created by photochemical reaction. The patterns are then developed in a developer specific to the layer of polymer resin that preferentially attacks either the fraction of the polymer resin layer that was polymerized by exposure (positive resin), or the fraction of the polymer resin layer that was not exposed (negative resin). After the development, a set of pads 14 and cavities 31 in the form of the mask is produced on the surface of the substrate.

The layer of polymer resin used may for example be PMMA (polymethyl methacrylate) with a 2% dilution. It is understood that 2% PMMA is mentioned here for purely illustrative purposes for the polymer resin layer. The resins MaN-2403 or MaN-2405 or SU8 may also be used. The use of other materials, including non-polymeric materials, may also be considered: The only condition being that the layer that covers the substrate may be selectively eliminated.

PMMA is polymethyl methacrylate, the molecular mass of which varies between 50000 (fifty thousand) and 2.2 million. In general, the higher the molecular weight, the slower the dissolution in a solvent.

DUV "Deep Ultra-Violet" photosensitive resins may also be used, which typically are polymers based on polyhydroxystyrenes with a photoacid generator procuring the change in solubility after exposure.

An amplified negative photosensitive resin based on epoxide type polymers and the release of Lewis acid by the photoinitiator may also be used.

In general, the photosensitive resin layer may be positive or negative photosensitive or electrosensitive. It will be noted that the pads and cavities in the photosensitive resin layer may also be obtained by electronic lithography.

This substrate covered with pads 14 of a chosen form may also be obtained by nanoimprinting of the polymer resin layer. Nanoimprinting consists of using a mold that contains the impression of the relief that one attempts to produce in the resin. Following deposition of the polymer resin layer onto the substrate, this layer of polymer resin is pressed by using the mold. If the mold contains the patterns of the cavities separating the pads in relief, pads and cavities are found directly imprinted in the resin. The imprinting is generally hot imprinting at a temperature where the resin is relatively fluid. For example, an SU8 resin at a temperature of 50° C. may be used.

Next, the resin is cooled and it solidifies, and the mold is carefully removed. The mold is generally covered by an anti-adhesive layer to facilitate its removal, preventing the patterns formed in the resin from tearing off during removal.

Once these pads 14 and these cavities 31 are made on the surface of the substrate 12, the process according to this embodiment comprises a step of depositing a multilayer onto the set of pads and cavities.

To do this, first of all a first thin layer 16 of magnetic material is deposited on top of the pads 14 (FIG. 4c).

This thin layer 16 of magnetic material may for example be constituted of a permalloy (NiFe), or other soft alloys based on Ni, Fe and Co (for example Co90Fe10) or a rare earth/transition metal alloy (for example SmCo), or other magnetic materials. Several thin layers of magnetic materials, or even several thin layers of magnetic and ferromagnetic materials may also be deposited, depending on the desired composition for the first jaw.

The process according to this embodiment then comprises a step of depositing a sacrificial layer 17 on the thin layer 16. This sacrificial layer 17 may be a metal, insulating, semiconductor or polymer layer. The sacrificial layer may for example be made in aluminum, silica, GaAs, PMMA, or any other material known to be destructible by chemical attack in liquid or gaseous medium. However, it is important that this layer be made in another material than said pads 14 on which the layer 16 is deposited so that the sacrificial layer and pads 14 may be removed under the effect of different destructive agents so as to be able to control independently the disappearance of the sacrificial layer and the disappearance of pads 14.

The process according to the invention then comprises a step of depositing a second thin layer 18 onto the sacrificial layer 17 (FIG. 4d).

This second thin layer 18 is also in a magnetic material. This second thin layer 18 may for example be formed of the same magnetic material or another magnetic material. At this stage, one may also deposit several thin layers of magnetic materials, depending on the desired composition for the second jaw.

As shown in FIGS. 1 and 2, the magnetostatic interactions between the magnetizations of the two jaws naturally induce the antiparallel orientation at zero field of the magnetizations in the manner of two bar magnets whose opposite poles attract each other (North pole-South pole attraction). The amplitude of this magnetostatic interaction may easily be estimated by the person skilled in the art by using conventional magnetostatic expressions and by taking the magnetizations of the single domain jaws. Thin layers 16, 17 and 18 are for example deposited by cathode sputtering, or by any other thin layer deposition methods that can be used, for example molecular beam epitaxy, electrodeposition or ADL (Atomic Layer Deposition).

The presence of pads 14 separated by cavities 31 enables the different layers 16, 17, 18 deposited on the surface of the substrate to be cut along the longitudinal direction so that they form a stack 19 of longitudinal section equal to the longitudinal section of the tweezer to be produced.

The form of the magnetic tweezer therefore depends on the form of the upper surface of the pads 14. The upper surface of pads 14 may take any form, the only limitation being the resolution of the lithography or nanoimprinting technique used to produce pads 14 on the surface of the substrate. For example, the upper surface of the pads may be square or rectangular, round or elliptic, etc.

In this first embodiment, stack 19 is thus formed at the top of pads 14. However, using stack 19', produced at the bottom of cavities 31, may also be considered. In this case, the form of the magnetic tweezer would depend on the form of the cavities 31 between the pads 14.

In addition, in this case, if one wishes to subsequently be able to separate the magnetic thin layers from the substrate, one must, prior to depositing the layer of polymer resin on the substrate, deposit a support layer that covers the substrate and that can subsequently be dissolved, or selectively eliminated by another method, so as to separate the stacks found at the bottom of the cavities of the substrate surface.

FIGS. 4e to 4h show the steps of fabricating stack 19 according to another embodiment of the invention.

In this embodiment, one starts off with a substrate 12 with a smooth surface, for example in silicon.

When one wishes to subsequently be able to separate the magnetic tweezer from the substrate 12, a support layer 30 is deposited on the surface of this substrate 12. This support layer 30 is preferably in polymer that will subsequently be selectively eliminated in order to separate stack 19 from substrate 12. For example, it is a thin layer in polymer of homogeneous thickness. The chosen polymer is for example PMMA (polymethyl methacrylate).

Next a layer of polymer resin is deposited in order to make on support layer 30 pads 14 separated by cavities 31. The process enabling pads separated by cavities to be made is identical to that described with reference to FIG. 4*b*.

A first thin layer 16 of magnetic material is then deposited on the set formed by pads 14 and cavities 31. In this embodiment, the part of the thin layer 16 that interests us is not the part found at the top of pads 14 but is the part of the thin layer found at the bottom of cavities 31. In this embodiment, relief 13 that enables the form of stack 19 to be defined is therefore constituted of cavities 31. Thus, the form of the bottom of each cavity corresponds to the form of the magnetic tweezer to be produced.

Following deposition of the first thin layer 16, the pads 14 are dissolved (FIG. 4*f*). Next a series of first jaws 2 is obtained, deposited on support layer 30. A sacrificial layer 17' is then deposited on the assembly of first jaws 2 such that this sacrificial layer completely covers the first jaws.

This sacrificial layer 17' is sufficiently thick so that part 34 of the sacrificial layer 17' that is found above each first jaw 2 presents a thickness e equal to the desired thickness for the sacrificial layer in stack 19. In addition, this sacrificial layer 17' presents a flat upper surface, despite the presence of first jaws 2 on the surface of the support layer 30.

As shown in FIG. 4*g*, a set of upper pads 14' and upper cavities 31' is then produced on the surface of the sacrificial layer 17' such that each upper cavity 31' is found above one of the first jaws 2. The upper pads 14' and upper cavities 31' present identical dimensions to those of pads 14 and cavities 31 previously made on the support layer 30.

A second thin layer 18 in magnetic material is deposited on the upper pads 14' and upper cavities 31'.

The deposition techniques and the composition of layers 16, 17' and 18 are identical to those described with reference to FIGS. 4*b* to 4*d*.

The upper pads 14' are then dissolved, as well as the part of the sacrificial layer 17' that is found under these pads 14'. On the contrary, support layer 30 is spared during this step, as well as the part of the sacrificial layer 17' that is found between the first and second jaws of each stack 19. To do this, the different sacrificial layers are dissolved with chemical solvents of different natures, by using the dissolution selectivity of one layer with relation to the other. The sacrificial layer 17' is eliminated by anisotropic etching to spare the part situated between the jaws.

Stacks 19 of forms identical to the forms of the tweezers to be produced are then obtained (FIG. 4*h*).

A third process for producing stack 19 is represented in FIGS. 4*i* and 4*j*.

In this embodiment, one starts off with a substrate 12, for example in silica.

This substrate 12 is covered with a support layer 30 that completely covers the surface of substrate 12. A first magnetic thin layer 16 is then deposited on the assembly of the support layer 30, and then a sacrificial layer 17 is deposited on the assembly of the first thin layer 16. A second magnetic thin layer 18 is then deposited on the assembly of the sacrificial layer 17.

A continuous multilayer 33 that completely covers the surface of the substrate 12 and that is formed by the first magnetic thin layer 16, the second magnetic thin layer 18 and the sacrificial layer 17 is then obtained.

The volume of stack 19 is then defined in this multilayer 33 by optical or electronic lithography followed by chemical etching or ionic bombardment (FIG. 4*j*).

At the end of this first step, a stack 19 is thus obtained, formed by the first and second jaws 2 and 3, between which is found a sacrificial layer that interconnects the two jaws.

Once this stack 19 is made, the process according to the invention comprises a step of depositing a hinge 9 that interconnects the first and second jaws. Different processes for producing the hinge are represented in FIGS. 5*a* to 5*h*.

The hinge 9 may be made by depositing a thin layer on the lateral edge 11 of stack 19, and possibly on the upper surface of the stack.

To do this, the material making up the hinge may be deposited in oblique incidence (FIGS. 5*a* to 5*d*). The material constituting the hinge is preferably deposited by cathode sputtering, but other deposition techniques may be used (molecular beam epitaxy, electrodeposition, ALD, etc.).

The material constituting the hinge is preferably an elastically deformable metal or polymer, for example gold, silver, copper, platinum, etc.

The material constituting the hinge 9 may also be made by lithography and then deposition in oblique incidence (FIGS. 5*e* to 5*h*). In this case, a pillar 23 that extends along the lateral edge 11 of stack 19 is first of all made by lithography. And then, part 22 of the hinge that covers the second jaw is made by deposition in normal incidence. This deposition is preferably carried out by cathode sputtering, although any other deposition technique may be used.

If one wants the hinge to also cover the outer face of the first jaw 2 of the magnetic tweezer, the process for producing the stack also comprises, prior to the step of depositing the first layer 16, a step of depositing a layer 21 of the material constituting the hinge (FIGS. 5*b* and 5*d*).

Following the step of producing the hinge 9, the process comprises a step of releasing the two jaws by attack of the sacrificial layer 17 that is found between the two jaws. This step of attacking the sacrificial layer 17 may be done by chemical etching or dissolution, isotropic plasma or anisotropic etching of the sacrificial layer 17.

As shown in FIG. 6, the process according to the invention may also comprise a step during which the molecules are grafted onto the inner surface of the jaws.

To do this, layers 24, 25 of functionalizable material must have been previously deposited onto the surfaces of the jaws on which one wishes to graft molecules. Layers 24, 25 of functionalizable materials are deposited during fabrication of stack 19.

In the present case, layers 24, 25 of functionalizable materials have been deposited onto the inner surfaces 5 and 6 of the first and second jaws. A first layer 24 of functionalizable material has thus been deposited between the step of depositing the first thin layer 16 in magnetic material and the step of depositing the sacrificial layer 17. A second layer 25 of functionalizable material was deposited between the step of depositing the sacrificial layer 17 and the step of depositing the second layer 18 in magnetic material.

The outer surfaces 7 and 8 of the jaws may also be covered by layers of functionalizable materials and/or layers of biocompatible materials, depending on the desired utilization of the tweezer. To do this, these layers must be deposited before deposition of the first thin layer in magnetic material 16 and after deposition of the second thin layer in magnetic material 18.

The functionalizable materials used here are for example gold or silica.

In the case where the functionalizable material is gold and silica, deposition of layers of functionalizable material may be done for example via PVD (Physical Vapor Deposition), for example by cathode sputtering.

Chemical or biological species 26 may then be grafted onto these layers of functionalizable materials. When one wants to graft these chemical or biological species inside the jaws, the tweezer must be opened by using a magnetic field B. The chemical or biological species are then grafted inside the jaws. To do this, the chemical or biological species to be grafted are inserted successively in solution. For example, if one wishes to graft the biotin-streptavidin chemical pair, the chemical element Thiol is introduced into solution first. This chemical element then attaches to the layers of functionalizable materials. The chemical element Thiol then enables the element biotin, an element itself intended to recognize and be bound to the element streptavidin, to be bound at its ends.

The chemical or biological species that may be grafted onto the magnetic tweezers may for example be strands of DNA or RNA, antibodies/antigens, cells, molecules (monomers or oligomers) having for example properties of fluorescence or phosphorescence, polymer fibers (poly(3-hexylthiophene type)), radioactive tracers, etc. The grafting of other objects of a different form and/or nature may also be considered, for example objects for biological recognition (antibodies/antigens), carbon nanotubes, silicon or other semiconductors.

The process according to the invention may also comprise a step of separating the magnetic tweezers from the substrate. Such a step is represented in FIG. 7.

In the case where the magnetic tweezers are found at the top of pads 14 as represented in FIG. 6, the step of separating the magnetic tweezers from the substrate comprises a step of dissolving the pads 14. To do this, the substrate 12 covered with pads 14 and magnetic tweezers 1 is immersed into a solution of the appropriate solvent. In the case where the layer of polymer resin is a layer of 2% PMMA, the solvent used may be an acetone solution. Of course, other solvents may be used.

The solvent used must dissolve the resin pads 14 without affecting the species grafted onto the jaws. The solvent preferentially attacks resin pads 14 by their side, which first releases the magnetic tweezers situated at the top of the pads, which are found in suspension in the solvent. In the longer term, stack 19' made at the bottom of the cavities is also likely to become detached. To avoid having both the magnetic tweezers 1 from the top of the pads and the stack 19' from the bottom of the cavities in the solvent, the substrate must be removed from the solvent once the magnetic tweezers 1 have detached from the top of the pads.

In the case where the magnetic tweezers are integral with the support layer 30 in polymer (FIG. 4h or 4j), this support layer 30 is also dissolved such that the magnetic tweezers are released in solution. In the case where this support layer is also in 2% PMMA, the solvent used to dissolve the support layer may also be acetone.

At the end of this step, magnetic tweezers 1 are thus found in solution. They may then be used directly in solution or transferred into a second solution, for example buffered water.

To do this, one may position a second substrate on the surface of the solution in which the magnetic tweezers are found such that the surface of the second substrate is in contact with the solution.

A magnet is then applied to the back of the second substrate so as to attract the magnetic tweezers against the surface of the second substrate. The substrate and the magnetic tweezers are then removed from the solution while keeping the magnet at the back of the substrate. The magnetic tweezers may then be used on this second substrate or else they may be redispersed in a second solution by doing the reverse operation, i.e., by positioning the second substrate with the magnetic tweezers in contact with the second solution and by removing the magnet from the back of the second substrate so that the magnetic tweezers are no longer attracted to the magnet and go into the second solution.

FIGS. 8 to 12 represent different utilizations of the magnetic tweezers according to the invention. The magnetic tweezers used in these figures are magnetic tweezers identical to the magnetic tweezers described with reference to FIGS. 1a and 1b, i.e., they comprise two jaws presenting an antiparallel magnetic alignment when no magnetic field is applied, and a magnetic alignment parallel to the Y axis when a magnetic field parallel to the Y axis is applied. In all of the applications described with reference to FIGS. 8 to 12, magnetic field B applied to cause movement of the jaws is therefore a magnetic field parallel to the Y axis. Of course, magnetic tweezers presenting jaws with different magnetizations may be used in the same manner by applying a suitable magnetic field to their magnetization.

In the case of FIG. 8, the magnetic tweezer is functionalized with the probe molecules 28 fixed on the inner surface 5, 6 of jaws 2 and 3 of the magnetic tweezer 1. When no magnetic field is applied, the magnetic tweezer 1 is closed and no object may be gripped by their jaws (FIGS. 8, A1). When a magnetic field B is applied (FIG. 8, A2), jaws 2, 3 of the magnetic tweezer may open and an object 27 may come between jaws 2 and 3 of the tweezer. When object 27 presents a chemical affinity with the probe molecules 28 on the surface of the jaws, it binds with these probe molecules. The jaws of the tweezer may then be closed again on the object (FIG. 8, A3). The molecular bond strength between the probe molecules 28 and the object 27 may then be measured or calculated by measuring the field B necessary to open the magnetic tweezer in the presence of object 27 between these jaws (FIG. 8, A4). When the magnetic tweezer is functionalized, the objects 27 that are captured by the magnetic tweezer 1 and that bind with these probe molecules 28 can no longer be released in solution by only magnetic actuation and they remain integral with at least one jaw of the tweezer.

FIG. 9 represents non-functionalized magnetic tweezer 1. These magnetic tweezer may grip objects 27 and then release them in solution (FIG. 9, B4).

The magnetic tweezer 1 may also be used to heat an object 27 taken between these jaws. To do this, once the object is found between the jaws of the tweezer, the jaws of the tweezer are closed on the object and then a high-frequency magnetic field B (of between a few tens and several hundreds of kilohertz) is applied to the tweezer. The tweezer is then heated by hyperthermia. Depending on the rigidity of the tweezer, their mass and viscosity, the tweezer may remain practically immobile at these frequencies, and the object captured between the jaws of the tweezer may then be brought to the temperature of the magnetic material.

Such a heating process may for example be used to destroy cancer cells by hyperthermia. In this case, the magnetic tweezers according to the invention are introduced into the human body and guided, thanks to a magnetic field, to the cancer cells, or transported to the destination by a non-magnetic process. The magnetic tweezers are then opened and closed onto the cancer cells. A high-frequency magnetic field B is then applied to the magnetic tweezers so as to destroy the cancer cells by heating. This process is described more specifically in the document "Biofunctionalized magnetic-vortex microdiscs for targeted cancer-cell destruction" Dong-Hyun Kim & al, Univ. Chicago, Nature Materials, vol 9, pp 165-171, February 2010.

With reference to FIG. 11, the magnetic tweezers according to the invention may also be held in suspension in a fluid. To do this, the magnetic tweezers 1 are immersed in a fluid and then a sufficiently low (i.e., with a frequency between a few hertz and a few hundred hertz) frequency magnetic field B with suitable amplitude is applied to the magnetic tweezers such that the jaws of the tweezers perform small strokes that enable the magnetic tweezers to remain on the surface of the fluid, without falling to the bottom. The application of this alternating magnetic field enables the tweezers to remain in suspension in a fluid and therefore to circulate better in this fluid. In fact, if a magnetic field gradient is superimposed on this alternating magnetic field, the strokes of the tweezers will prevent the magnetic tweezers from snagging on the bottom of the recipient that contains the fluid. Consequently, the strokes of the jaws of the tweezers will facilitate their displacement.

With reference to FIG. 12, displacement of the magnetic tweezer may also be obtained by only applying an alternating magnetic field to the tweezer. In fact, by applying to the tweezer an asymmetrical alternating magnetic field of sufficient amplitude to orientate the magnetic moments of the magnetic layers, and with a frequency of between 1 hertz and a few hundred hertz, the temporal frequency and the temporal shape of the applied field being adjusted according to the viscosity of the fluid, a "swimming" effect of the magnetic tweezer may be created. For a given frequency, or a given temporal variation of the applied magnetic field, a sufficiently viscous fluid may enable more effective swimming movements than a slightly viscous fluid, the tweezer being better supported on the fluid, but a very high viscosity may also reduce the swimming effectiveness. A fluid that is not sufficiently viscous may require higher frequencies or more rapid temporal variations of the field. A compromise is to be found between the viscosity and the temporal variations of the magnetic field applied to obtain and optimize the "swimming" of the tweezer. So that this alternative opening and closing leads to a translation movement, it is necessary that the magnetic field alternatively varies in an asymmetrical manner: so that the tweezer advances from the side of the hinge, it is necessary that the closing of the tweezer is faster than their opening. Conversely, so that the tweezer goes backwards with relation to the position of the hinge, the opening must be faster than the closing. This "swimming" effect of the particle therefore enables the magnetic tweezer to be displaced without an applied field gradient, which is particularly advantageous in remote zones where a field gradient would be difficult to obtain.

Naturally, the invention is not limited to the embodiments described with reference to the figures and variations may be contemplated without departing from the scope of the invention. One may for example have jaws formed of several magnetic thin layers.

The invention claimed is:

1. A process for fabricating a magnetic tweezer on a surface of a substrate, the magnetic tweezer comprising two jaws, the two jaws being magnetostatically coupled, the two jaws being interconnected by a deformable hinge arranged at a first side of each of the two jaws, each of the two jaws having a second side that is opposite the first side, the two jaws extending along a longitudinal direction between the first and the second side, the deformable hinge extending along a transverse direction that is perpendicular to the longitudinal direction, the two jaws configured to be moved one with relation to the other under the action of a magnetic field, the process comprising:
    forming a stack on the surface of the substrate, the stack comprising at least two magnetic thin layers between which a sacrificial layer is arranged, the at least two magnetic thin layers being magnetostatically coupled, a first of the at least two magnetic thin layers forming at least part of a first of the two jaws and a second of the at least two magnetic thin layers forming at least part of a second of the two jaws, the stack presenting a longitudinal section equal to a desired longitudinal section for the magnetic tweezer to be fabricated, the stack presenting a lateral edge that defines the first side of each of the two jaws;
    depositing the deformable hinge onto at least the lateral edge of the stack; and
    after the depositing step, eliminating the sacrificial layer.

2. The fabrication process according to claim 1, wherein the forming comprises:
    forming at least one relief on the surface of the substrate, the at least one relief presenting an upper surface of longitudinal section equal to the desired longitudinal section for the magnetic tweezer to be produced;
    depositing at least one first magnetic thin layer on the upper surface of the at least one relief;
    depositing the sacrificial layer on the at least one first magnetic thin layer; and
    depositing at least one second magnetic thin layer on the surface of the sacrificial layer.

3. The fabrication process according to claim 2, wherein the at least one relief is formed by a pad projecting from the surface of the substrate.

4. The fabrication process according to claim 2, wherein the at least one relief is formed by a cavity formed in the surface of the substrate.

5. The process according to claim 4, comprising, prior to the forming, depositing a support layer on the surface of the substrate.

6. The process according to claim 1, wherein the forming comprises:
    depositing a support layer on the substrate;
    forming a first set of pads and cavities on the surface of the support layer, each cavity of the first set of pads and cavities presenting a bottom of longitudinal section equal to the desired longitudinal section for a lower jaw of the two jaws of the magnetic tweezer to be produced;
    depositing at least one first magnetic thin layer;
    eliminating the first set of pads and cavities by etching;
    depositing the sacrificial layer such that an upper surface of the sacrificial layer is flat and the at least one first magnetic thin layer is entirely covered by the sacrificial layer;
    forming at least one second set of pads and cavities on the surface of the sacrificial layer, each cavity of the second set of pads and cavities presenting a bottom of longitudinal section equal to the desired longitudinal section for an upper jaw of the two jaws of the magnetic tweezer to be produced;
    depositing at least one second magnetic thin layer; and
    eliminating the second set of pads and cavities and the part of the sacrificial layer that is located outside the stack by selective etching so as to only maintain on the support layer the stack of longitudinal section equal to the longitudinal section of the upper jaw of the tweezer to be produced.

7. The process according to claim 1, wherein the forming comprises:
   depositing at least one first magnetic thin layer on the surface of the substrate;
   depositing the sacrificial layer on the at least one first magnetic thin layer;
   depositing at least one second magnetic thin layer on the surface of the sacrificial layer;
   performing a lithography of the multilayer formed by the at least one first magnetic thin layer, the at least one second magnetic thin layer and the sacrificial layer so as to form a stack presenting a longitudinal section equal to the desired longitudinal section for the magnetic tweezer to be produced.

8. The process according to claim 1, wherein an upper surface of the substrate is covered by a support layer in polymer, the process comprising separating the magnetic tweezer from the substrate by attack and elimination of the support layer.

9. The process according to claim 1, wherein the deformable hinge connects the two jaws only between each other and not to a support.

10. The process according to claim 1, further comprising, following the eliminating, opening the two jaws of the tweezer and grafting chemical or biological species inside the two jaws of the magnetic tweezer.

11. The process according to claim 1, wherein the forming comprises one or more steps of depositing a biocompatible material.

12. The process according to claim 1, wherein the deformable hinge deposition is carried out in oblique incidence to cover both the lateral edge of the two jaws and at least one part of an upper surface of one of the two jaws.

13. The process according to claim 1, wherein the deformable hinge comprises a part perpendicular to the substrate, the part perpendicular to the substrate being formed by a pillar defined by optical or electronic lithography, a material constituting the pillar being deposited in incidence perpendicular to a plane of the substrate.

14. The process according to claim 1, wherein the sacrificial layer is eliminated by dissolution by using a solvent.

15. The process according to claim 1, wherein the sacrificial layer is eliminated by isotropic plasma or anisotropic etching.

* * * * *